United States Patent
Tsukao et al.

(10) Patent No.: US 10,404,254 B2
(45) Date of Patent: Sep. 3, 2019

(54) VEHICULAR DOOR OPERATION DETECTING APPARATUS

(71) Applicant: AISIN SEIKI KABUSHIKI KAISHA, Kariya-shi, Aichi-ken (JP)

(72) Inventors: Kosuke Tsukao, Toyota (JP); Takehiko Sugiura, Kariya (JP)

(73) Assignee: AISIN SEIKI KABUSHIKI KAISHA, Kariya-shi, Aichi-ken (JP)

( * ) Notice: Subject to any disclaimer, the term of this patent is extended or adjusted under 35 U.S.C. 154(b) by 148 days.

(21) Appl. No.: 15/786,983

(22) Filed: Oct. 18, 2017

(65) Prior Publication Data

US 2018/0109259 A1 Apr. 19, 2018

(30) Foreign Application Priority Data

Oct. 19, 2016 (JP) .................................. 2016-205375

(51) Int. Cl.
- *B60J 5/10* (2006.01)
- *E05F 15/73* (2015.01)
- *G07C 9/00* (2006.01)
- *H03K 17/955* (2006.01)

(52) U.S. Cl.
CPC ............ *H03K 17/955* (2013.01); *B60J 5/101* (2013.01); *E05F 15/73* (2015.01); *E05Y 2400/858* (2013.01); *E05Y 2900/532* (2013.01); *G07C 9/00714* (2013.01); *G07C 2209/14* (2013.01); *G07C 2209/64* (2013.01); *H03K 2217/94042* (2013.01)

(58) Field of Classification Search
None
See application file for complete search history.

(56) References Cited

U.S. PATENT DOCUMENTS

| | | | |
|---|---|---|---|
| 9,475,369 B2 | 10/2016 | Sugiura et al. | |
| 2016/0117875 A1* | 4/2016 | Duchemin | G07C 9/00126 340/5.72 |
| 2016/0169708 A1* | 6/2016 | Sterk | H03K 17/955 324/658 |
| 2018/0245394 A1* | 8/2018 | Herthan | B60R 25/2054 |

FOREIGN PATENT DOCUMENTS

JP 2015-21238 A 2/2015

* cited by examiner

*Primary Examiner* — Jared Fureman
*Assistant Examiner* — Aqeel H Bukhari
(74) *Attorney, Agent, or Firm* — Sughrue Mion, PLLC

(57) ABSTRACT

A vehicular door operation detecting apparatus includes a first electrode and a second electrode mounted at a vehicle and positioned away from each other, a switch member switching the first electrode and the second electrode between a conductive state and an open state, and a control portion controlling the switch member and detecting an operation of the user relative to a door for the vehicle by sensing a total capacitance obtained by the first electrode and the second electrode in a first mode where the total capacitance is sensed each predetermined intermittent time and by sensing an individual capacitance of each of the first electrode and the second electrode in a second mode where the individual capacitance is sensed each detection time shorter than the predetermined intermittent time in a case where a presence of the user is determined because the total capacitance exceeds a detection threshold value.

3 Claims, 4 Drawing Sheets

VEHICULAR DOOR OPERATION DETECTING APPARATUS

CROSS REFERENCE TO RELATED APPLICATIONS

This application is based on and claims priority under 35 U.S.C. § 119 to Japanese Patent Application 2016-205375, filed on Oct. 19, 2016, the entire content of which is incorporated herein by reference.

TECHNICAL FIELD

This disclosure generally relates to a vehicular door operation detecting apparatus.

BACKGROUND DISCUSSION

A known vehicular door operation detecting apparatus is disclosed, for example, in JP2015-21238A which is hereinafter referred to as Reference 1. The vehicular door operation detecting apparatus disclosed in Reference 1 includes a lower capacitance sensor, an upper capacitance sensor and a control portion. The lower capacitance sensor includes at least two sensor portions provided at a vehicle so as to be spaced away from each other and detects the leg (foot) portion of a user (human being). The upper capacitance sensor is provided at an upper side of the lower capacitance sensor to detect the body of the user except for the leg portion thereof. The control portion outputs a drive signal to a drive unit of a vehicle door for driving the vehicle door to open or close in a case where the control portion inputs a detection signal from one of the sensor portions of the lower capacitance sensor and a detection signal from the upper capacitance sensor. The control portion is inhibited from outputting the drive signal to the drive unit in a case where the control portion inputs detection signals from two or more of the sensor portions.

According to the aforementioned construction, possibility of wrong door opening and closing because of a detection of a small animal or an object, for example, by only the lower capacitance sensor may decrease. In addition, safety of the user is secured because the door opening or closing is not started or is stopped in a case where at least the two sensor portions of the lower capacitance sensor detect the user.

According to the vehicular door operation detecting apparatus disclosed in Reference 1, in order to detect an operation of the user related to opening and closing of the door which is hereinafter referred to as an operation of the user relative to the door, even when an engine of the vehicle is stopped, sensing by the capacitance sensor needs to be continued while battery consumption is restrained. Thus, the control portion performs the sensing intermittently (which corresponds to an intermittent sensing mode) in a case where the user is not present around the vehicle (specifically, the capacitance sensor) and performs the sensing continuously (which corresponds to a continuous sensing mode) in a case where the user comes closer to the vehicle, thereby restraining the battery consumption.

In this case, the battery consumption may be reduced by increasing an intermittent time. Nevertheless, the increase of the intermittent time may increase possibility of a delay of detection timing for detecting presence of the user, which may inhibit a prompt detection of the operation of the user relative to the door.

A relationship between the intermittent time and the detection timing for the presence of the user, for example, is explained in detail below. FIGS. 6 and 7 are time charts each of which illustrates changes of a capacitance in a case where the user comes closer to the vehicle and thereafter leaves the vehicle (i.e., capacitance sensor). Detection ability of the capacitance sensor is the same between FIGS. 6 and 7. In FIGS. 6 and 7, each filled circle indicates a sensing time point at which the capacitor sensor performs the sensing. For example, in the intermittent sensing mode, the presence of the user is detected (i.e., determined) when a capacitance Cs exceeds a predetermined detection threshold value Cth at the aforementioned sensing time point.

In FIG. 6, the sensing is performed each detection time T (which is a calculation time for a required process, for example) T in the continuous sensing mode while the sensing is performed each intermittent time T_long80 (>1) which is longer than the detection time T in the intermittent sensing mode.

Accordingly, the presence of the user is detected for the first time at the time the capacitance Cs exceeds the detection threshold value Cth at a sensing time point t81 in the intermittent sensing mode. That is, at a sensing time point t80 (=t81−T_long80) immediately before the sensing time point t81, the presence of the user is not detected because though the capacitance Cs approximates the detection threshold value Cth, the capacitance Cs does not yet exceed the detection threshold value Cth. The intermittent sensing mode is switched to the continuous sensing mode at the sensing time point t81 and the sensing is repeatedly performed each detection time T until the operation of the user is detected.

In FIG. 7, the sensing is performed each detection time T in the continuous sensing mode while the sensing is performed each intermittent time T_long 90 (>T_long 80) in the intermittent sensing mode.

Accordingly, the presence of the user is detected for the first time at the time the capacitance Cs exceeds the detection threshold value Cth at a sensing time point t91 in the intermittent sensing mode. That is, at a sensing time point t90 (=t91−T_long90) immediately before the sensing time point t91, the presence of the user is not detected because though the capacitance Cs approximates the detection threshold value Cth, the capacitance Cs does not yet exceed the detection threshold value Cth. The intermittent sensing mode is switched to the continuous sensing mode at the sensing time point t91 and the sensing is repeatedly performed each detection time T until the operation of the user is detected.

As clearly seen from FIGS. 6 and 7, although the changes of the capacitance Cs are the same between FIGS. 6 and 7, the sensing time point t91 at which the sensing mode is switched to the continuous sensing mode as illustrated in FIG. 6 is delayed from the sensing time point t81 at which the sensing mode is switched to the continuous sensing mode as illustrated in FIG. 7. That is, the increase of the intermittent time may cause a delay of a start time of the continuous sensing mode, depending on timing of the sensing. In a case where the start time of the continuous sensing mode is delayed, prompt detection of the user's operation relative to the door may not be detected.

A need thus exists for a vehicular door operation detecting apparatus which is not susceptible to the drawback mentioned above.

SUMMARY

According to an aspect of this disclosure, a vehicular door operation detecting apparatus includes a first electrode and a second electrode mounted at a vehicle and positioned away from each other, each of the first electrode and the second electrode being configured to be individually capacitively coupled to a body of a user of the vehicle approaching each of the first electrode and the second electrode, a switch member switching the first electrode and the second electrode between a conductive state where the first electrode and the second electrode are electrically connected to each other and an open state where the first electrode and the second electrode are electrically disconnected from each other, and a control portion controlling a switching operation of the switch member and detecting an operation of the user relative to a door for the vehicle by sensing a total capacitance obtained by the first electrode and the second electrode which are switched to the conductive state in a first mode where the total capacitance is sensed each predetermined intermittent time and by sensing an individual capacitance of each of the first electrode and the second electrode which are switched to the open state in a second mode where the individual capacitance is sensed each detection time shorter than the predetermined intermittent time in a case where a presence of the user is determined because the total capacitance exceeds a detection threshold value.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Figure 1:
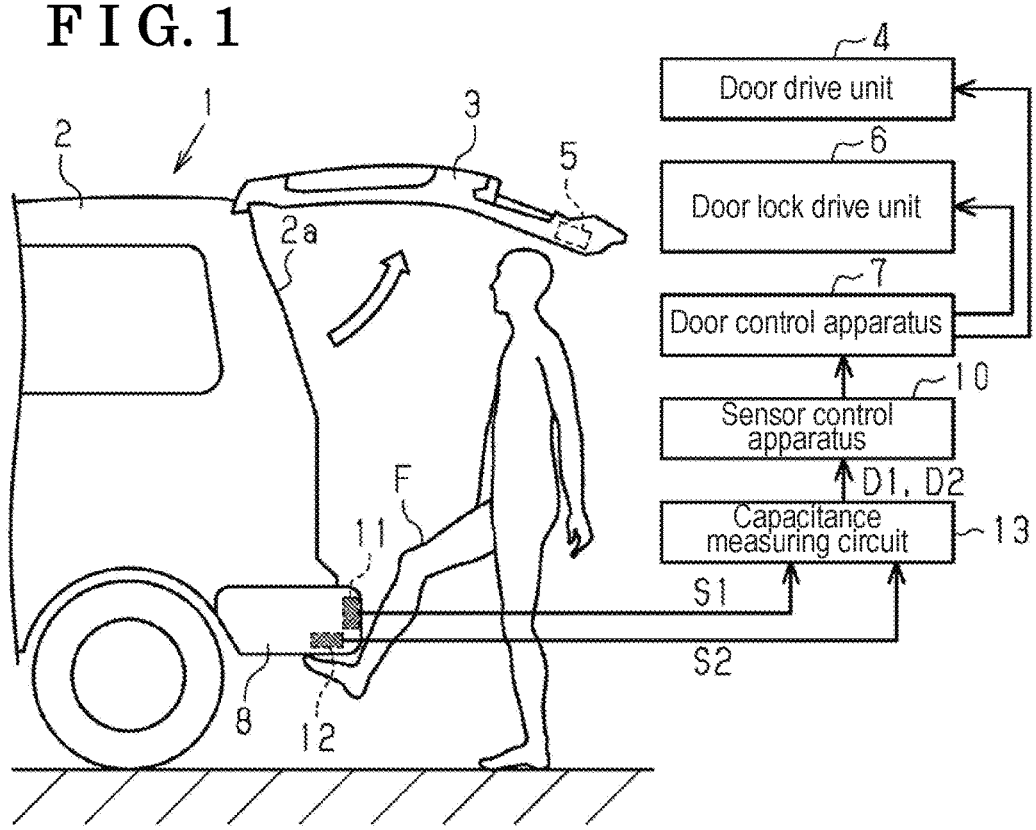
FIG. 1 is a side view illustrating a rear construction of a vehicle to which a vehicular door operation detecting apparatus is applied according to an embodiment disclosed here.

An embodiment of a vehicular door operation detecting apparatus is explained below. As illustrated in FIG. 1, an opening 2a is provided at a rear portion of a body 2 of a vehicle 1 such as an automobile, for example. A back door 3 serving as a door is mounted at the rear portion of the body 2 so as to open and close via a door hinge which is provided at an upper portion of the opening 2a. The back door 3 is opened by being pushed up with reference to the door hinge. A door lock 5 is mounted at a tip end of the back door 3 at a vehicle interior side for locking and unlocking the back door 3 when the back door 3 is in a closed state.

A door drive unit 4 is mounted at the rear portion of the body 2, for example. The door drive unit 4 is mainly composed of an electrical drive source such as an electric motor, for example. The door drive unit 4 is mechanically connected to the back door 3 via an appropriate door drive mechanism so as to drive the back door 3 to open and close. A door lock drive unit 6 is mounted at the back door 3 in a state being arranged adjacent to the door lock 5, for example. The door lock drive unit 6 is mainly composed of an electrical drive source such as an electric motor, for example. The door lock drive unit 6 is mechanically connected to the door lock 5 via an appropriate lock drive mechanism so as to drive the door lock 5 to be locked and unlocked.

The door drive unit 4 and the door lock drive unit 6 are both electrically connected to a door control apparatus 7 which is composed of a microcontroller unit (MCU), for example. The door drive unit 4 and the door lock drive unit 6 are separately and individually driven and controlled by the door control apparatus 7.

A rear bumper 8 is mounted at the rear portion of the body 2 so as to extend in a width direction of the vehicle at a lower side of the back door 3. An upper electrode 11 serving as a first electrode of a capacitance sensor and a lower electrode 12 serving as a second electrode of the capacitance sensor are mounted at the rear bumper 8. The upper electrode 11 is provided vertically so as to face rearward. The lower electrode 12 positioned at a lower side of the upper electrode 11 is provided to face downward.

The upper electrode 11 and the lower electrode 12 are electrically connected to a capacitance measuring circuit 13. The capacitance measuring circuit 13 is electrically connected to a sensor control apparatus 10 serving as a control portion and being composed of a microcontroller unit (MCU), for example. The capacitance measuring circuit 13 basically outputs oscillation signals to the upper electrode 11 and the lower electrode 12 respectively so that the upper electrode 11 and the lower electrode 12 output detection signals S1 and S2 [V] based on capacitances of the upper electrode 11 and the lower electrode 12.

Accordingly, the upper electrode 11 and the lower electrode 12 individually and separately output the detection signals S1 and S2 to the capacitance measuring circuit 13. The detection signals S1 and S2 change depending on contact or approach of an object, i.e., a leg portion F serving as a human body (body portion), for example, relative to the rear bumper 8. The capacitance measuring circuit 13 basically outputs detection data D1 and D2 resulting from an analog-digital (A/D) conversion of the detection signals S1 and S2 to the sensor control apparatus 10. According to the embodiment, an operation where a user (human being) puts one's leg portion F into a lower side of the rear bumper 8 represents an operation related to opening and closing of the back door 3, i.e., an operation of the user relative to the back door 3. Such operation corresponds to a regular operation according to the embodiment.

The sensor control apparatus 10 basically detects the operation of the user relative to the back door 3 based on the detection data D1 and D2. The sensor control apparatus 10 is electrically connected to the door control apparatus 7 so as to transmit a user operation detection signal indicating a detection result of the operation of the user relative to the back door 3 to the door control apparatus 7. The door control apparatus 7 drives and controls the door drive unit 4 and the door lock drive unit 6 based on the user operation detection signal.

Figure 2:
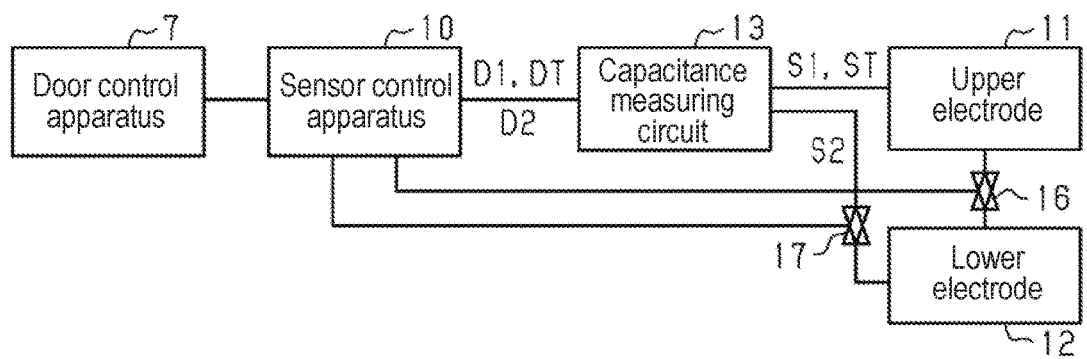
FIG. 2 is a block diagram illustrating an electric configuration of the vehicular door operation detecting apparatus.

As illustrated in FIG. 2, the upper electrode 11 and the lower electrode 12 are electrically connected to each other via an analog switch 16 which is constituted by a transistor (for example, FET or BJT), for example. The lower electrode 12 is electrically connected to the capacitance measuring circuit 13 via an analog switch 17 which is constituted by a transistor, for example. The analog switches 16 and 17 are switched individually and separately from each other between a conductive state and an open state based on a drive signal output from the sensor control apparatus 10. For example, in a case where the analog switch 16 is switched to the open state while the analog switch 17 is switched to the conductive state, the upper electrode 11 and the lower electrode 12 individually and separately output the detection signals S1 and S2. That is, the upper electrode 11 and the lower electrode 12 are in an open state. On the other hand, in a case where the analog switch 16 is switched to the conductive state while the analog switch 17 is switched to the open state, the upper electrode 11 and the lower electrode 12 function as substantially one electrode. That is, the upper electrode 11 and the lower electrode 12 are in a conductive state. The upper electrode 11 outputs the detection signal S1 in a voltage level based on a total capacitance which is obtained together with the lower electrode 12 (which is hereinafter also referred to as a combined detection signal ST) to the capacitance measuring circuit 13. The capacitance measuring circuit 13 outputs the detection data D1 resulting from the A/D conversion of the combined detection signal ST (which is hereinafter also referred to as a combined detection data DT) to the sensor control apparatus 10. The sensor control apparatus 10 detects or determines whether or not the user is present on a basis of the combined detection data DT. At this time, the lower electrode 12 stops outputting the detection signal S2. The analog switches 16 and 17 collectively serve as a switch member switching the upper electrode 11 and the lower electrode 12 between the conductive state and the open state.

Figure 6:
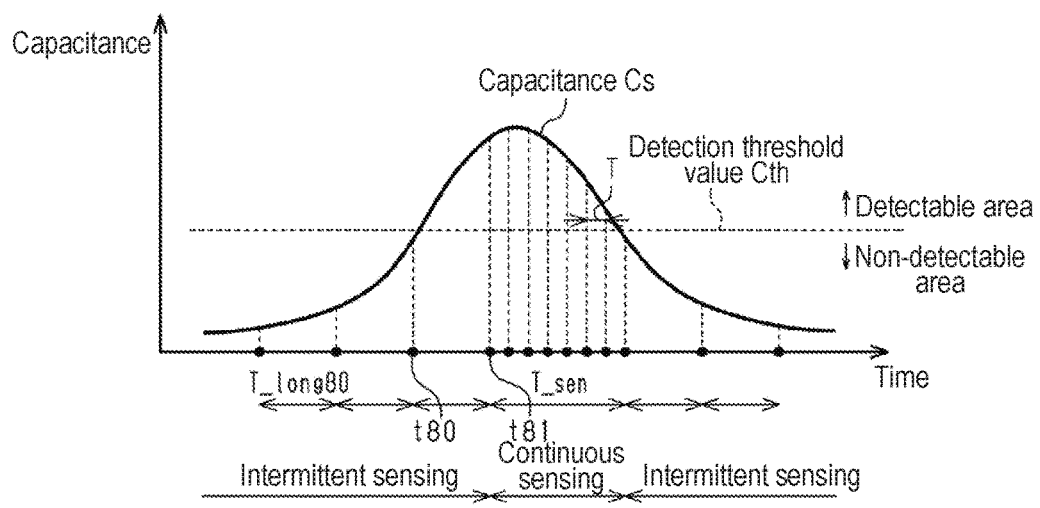
FIG. 6 is a time chart illustrating changes of a capacitance together with timing at which the sensing mode is switched to the continuous sensing mode in a case where the user comes closer to the vehicle and then leaves the vehicle according to a known apparatus.
Figure 7:
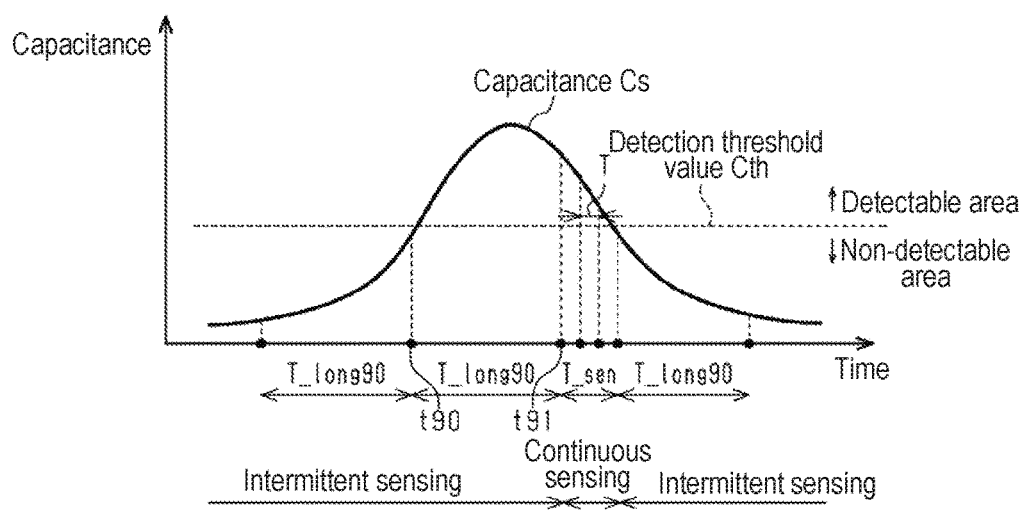
FIG. 7 is a time chart illustrating changes of a capacitance together with timing at which the sensing mode is switched to the continuous sensing mode in a state where an intermittent time is relatively elongated in a case where the user comes closer to the vehicle and then leaves the vehicle according to another known apparatus.

Next, a relationship between the conductive state and the open state of the upper electrode 11 and the lower electrode 12, and a detectable area where the presence of the user is detectable on a basis of the capacitance is explained. The detectable area is defined on a basis of the longest distance from the user obtained in a case where the detection data such as D1, for example, related to the capacitance exceeds a predetermined detection threshold value Dth (which is a detection data corresponding to a detection threshold value Cth in FIGS. 6 and 7 each of which illustrates a known vehicular door operation detecting apparatus). Thus, the detectable area changes depending on an output level of the oscillation signal by which each of the upper electrode 11 and the lower electrode 12 is driven. In the following, the explanation is made under conditions that the output level of the oscillation signal is identical.

Figure 3A:
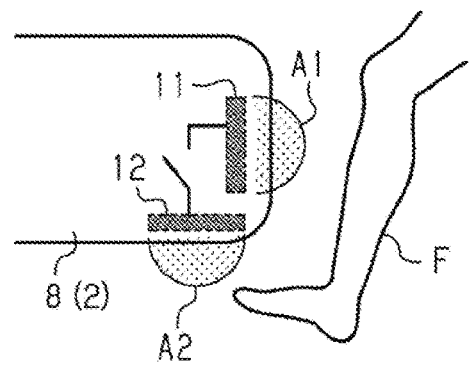
FIG. 3A is a schematic view explaining a detectable area in a case where an upper electrode and a lower electrode of the vehicular door operation detecting apparatus are in an open state.

As illustrated in FIG. 3A, in a case where the upper electrode 11 and the lower electrode 12 are in the open state, i.e., electrically disconnected from each other, the upper electrode 11 and the lower electrode 12 form detectable areas A1 and A2 respectively (which are illustrated as patterned portions in FIG. 3A) depending on respective electrode areas of the upper electrode 11 and the lower electrode 12. The detectable area A1 of the upper electrode 11 expands rearward in a substantially semi-circular shape. The detectable area A2 of the lower electrode 12 expands downward in a substantially semi-circular shape. In this case, because each of the detectable areas A1 and A2 is relatively small, the leg portion F of the user necessarily sufficiently approaches the detectable areas A1 and A2 so that the presence of the user is detectable. That is, in a case where fluctuations or changes of the capacitance of either the upper electrode 11 or the lower electrode 12 are detected, possibility of the presence of the user is high.

Figure 3B:
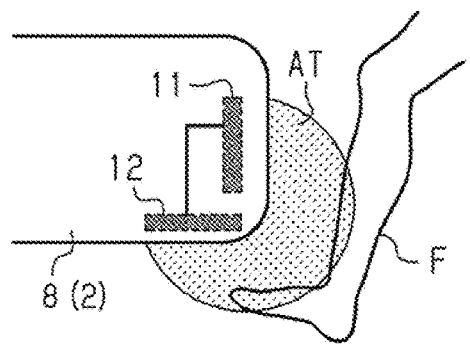
FIG. 3B is a schematic view explaining a detectable area in a case where the upper electrode and the lower electrode of the vehicular door operation detecting apparatus are in a conductive state.

On the other hand, in a case where the upper electrode 11 and the lower electrode 12 are in the conductive state, i.e., electrically connected to each other as illustrated in FIG. 3B, the upper electrode 11 forms a detectable area AT (which is illustrated as a patterned portion in FIG. 3B) depending on the electrode area obtained together with the lower electrode 12. The detectable area AT expands rearward and downward over and between the upper electrode 11 and the lower electrode 12 in a substantially major arc shape. In this case, because the detectable area AT is relatively large, the presence of the user is detectable at an early stage where the leg portion F of the user approaches the detectable area AT.

The sensor control apparatus 10 senses the combined detection data DT (i.e., the total capacitance of the upper electrode 11 and the lower electrode 12 which are connected to each other) each predetermined intermittent time so as to detect or determine the presence of the user. Specifically, the sensor control apparatus 10 performs an intermittent sensing, i.e., performs the sensing in an intermittent sensing mode serving as a first mode. In addition, the sensor control apparatus 10 senses the detection data D1 and D2 (i.e., the individual capacitance of each of the first electrode and the second electrode in a state where the first electrode and the second electrode are in the open state) each detection time shorter than the aforementioned intermittent time in a case where the combined detection data DT exceeds the detection threshold value Dth and the presence of the user is detected (i.e., determined). That is, the sensor control apparatus 10 performs a continuous sensing, i.e., performs the sensing in a continuous sensing mode serving as a second mode. The intermittent sensing is performed in a case where the user is not present in the vicinity of the vehicle 1 (the rear bumper 8) and the continuous sensing is performed in a case where the user comes closer to the vehicle 1 (the rear bumper 8) to thereby restrain battery consumption.

Next, a relationship between the intermittent time and the detection timing for the presence of the user, for example, is explained. The detection data and the detection threshold value Dth, and the capacitance and the detection threshold value Cth include a certain correlation to each other. Thus, in the following, the explanation is made on a basis of the capacitance. The same explanation is established in a case where the capacitance is replaced with the detection data.

Figure 4:
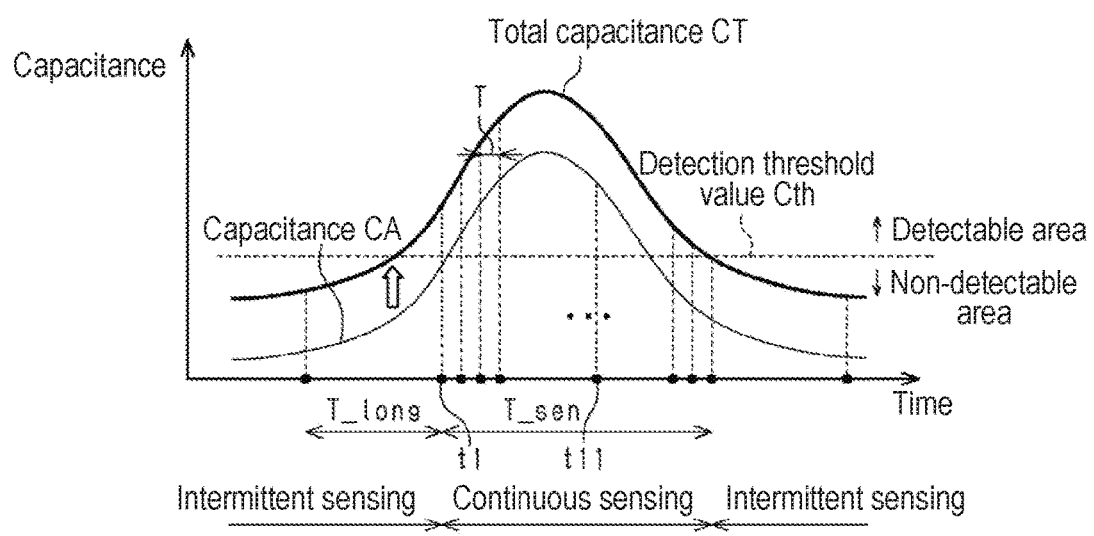
FIG. 4 is a time chart illustrating changes of a total capacitance of the upper electrode and the lower electrode together with timing at which a sensing mode is switched to a continuous sensing mode in a case where a user comes closer to the vehicle and then leaves the vehicle.

FIG. 4 is a time chart illustrating changes of a total capacitance CT (corresponding to the combined detection data DT) of the upper electrode 11 and the lower electrode 12 in a case where the user approaches the vehicle 1 (the rear bumper 8) and then leaves the vehicle 1 (the rear bumper 8). In FIG. 4, changes of a capacitance CA (corresponding to the detection data D1, for example) of either the upper electrode 11 or the lower electrode 12 are also illustrated. In FIG. 4, the changes of the capacitance CA are brought to match the changes of a capacitance Cs in FIGS. 6 and 7 for convenience.

In FIG. 4, each filled circle indicates a sensing time point at which the sensor control apparatus 10 performs the sensing. An intermittent time T_long in the intermittent sensing mode is specified to be equal to an intermittent time T_long90 in FIG. 7 for convenience. Thus, a sensing time point t11 at which the capacitance CA exceeds the detection threshold value Cth matches a sensing time point t91 in FIG. 7.

The total capacitance CT related to the detection of the presence of the user changes greater than the capacitance CA and includes higher detection ability. That is, the increase of the detectable area AT depends on the increase of change amount of the total capacitance CT. A sensing time point t1 at which the total capacitance CT exceeds the detection threshold value Cth in the intermittent sensing mode is earlier than the sensing time point t11 by an intermittent time T_long (=t11−T_long). The sensing time point t1 corresponds to a sensing time point t90 in FIG. 7. The intermittent sensing mode is switched to the continuous sensing mode at the sensing time point t1 and the sensing is repeated each detection time T until the operation of the user relative to the back door 3 is detected.

Accordingly, even in a case where the intermittent time T_long increases to restrain the battery consumption, the presence of the user is promptly detected by the sensor control apparatus 10. The operation of the user relative to the back door 3 is promptly detected by the sensor control apparatus 10 or securely detected for a sufficient time period.

Next, a control of the back door 3 by the sensor control apparatus 10 is explained. A process executed by the sensor control apparatus 10 is started when the engine of the vehicle 1 is stopped (or an ignition switch is turned off), for example.

Figure 5:
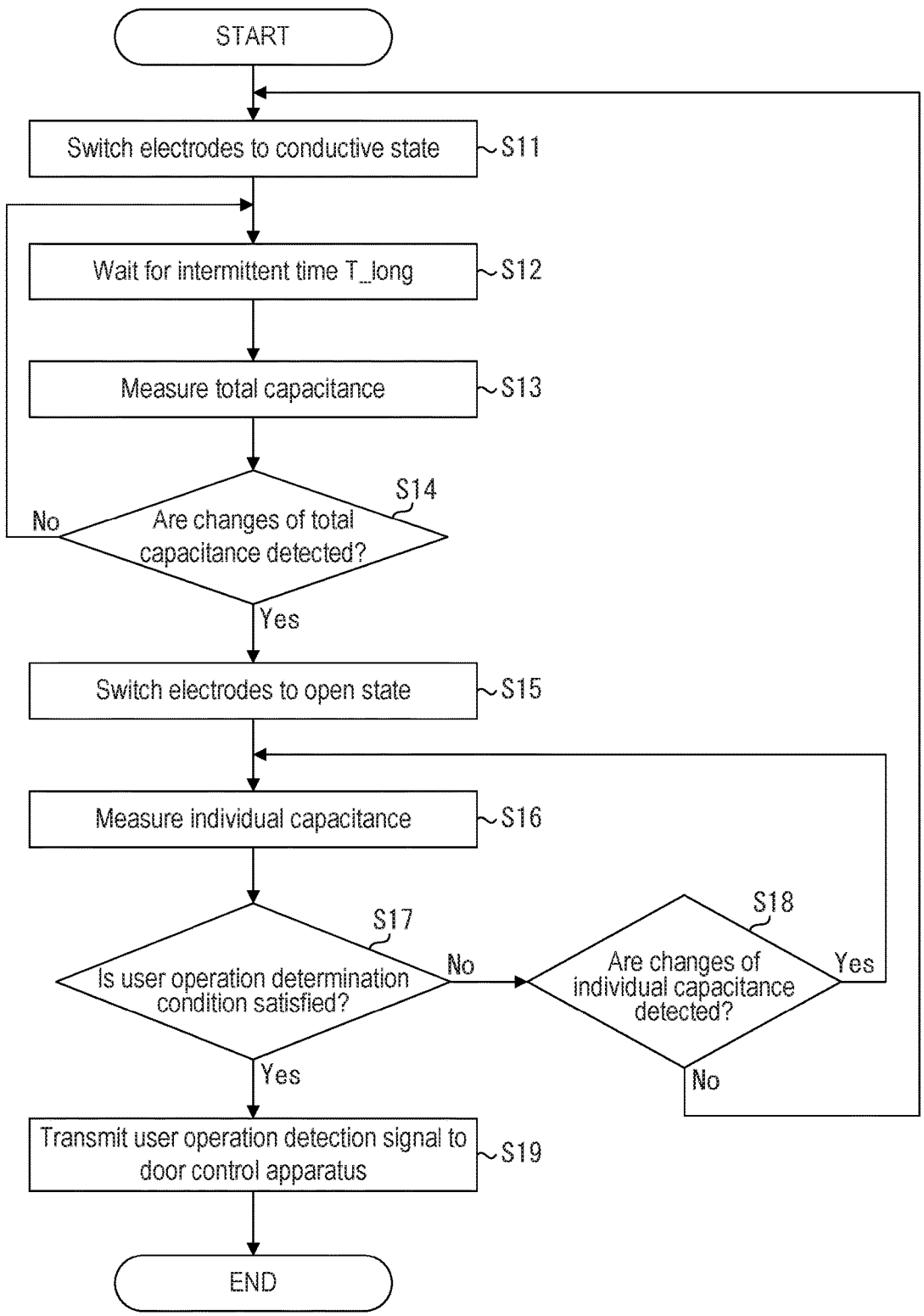
FIG. 5 is a flowchart illustrating a control of a back door by the vehicular door operation detecting apparatus.

The process is performed on a basis of a routine illustrated in FIG. 5. In step S11, the sensor control apparatus 10 controls the upper electrode 11 and the lower electrode 12 to be switched to the conductive state via the analog switches 16 and 17. The sensor control apparatus 10 then waits for the intermittent time T_long in step S12 and measures the total capacitance CT of the upper electrode 11 and the lower electrode 12 in step S13. Specifically, the sensor control apparatus 10 acquires the combined detection data DT at sensing timing (sensing time point) in the intermittent sensing mode.

Then, the sensor control apparatus 10 determines whether or not the changes of the total capacitance CT obtained by the upper electrode 11 and the lower electrode 12 are detected in step S14. Specifically, the sensor control apparatus 10 determines whether or not the combined detection data DT exceeds the detection threshold value Dth. In a case where it is determined that the combined detection data DT is below the detection threshold value Dth, the sensor control apparatus 10 determines that the user is not present and returns to step S12 to repeat the process. That is, the sensor control apparatus 10 repeats the process each intermittent time T_long unless it is detected that the combined detection data DT exceeds the detection threshold value Dth (i.e., the sensing in the intermittent sensing mode is performed).

On the other hand, in a case where it is determined that the combined detection data DT exceeds the detection threshold value Dth, the sensor control apparatus 10 controls the upper electrode 11 and the lower electrode 12 to be switched to the open state via the analog switches 16 and 17 in step S15. The sensor control apparatus 10 then individually measures a capacitance Cs1 of the upper electrode 11 and a capacitance Cs2 of the lower electrode 12 in step S16. Specifically, the sensor control apparatus 10 acquires the detection data D1 and D2 individually and separately.

The sensor control apparatus 10 then determines whether or not a user operation determination condition is satisfied on a basis of the detection data D1 and D2 in step S17. That is, the sensor control apparatus 10 determines whether or not the user operation determination condition is satisfied on a basis of a magnitude relationship between the detection data D1 and D2, for example. This is because it has been confirmed that the regular operation (normal operation) by the user influences the magnitude relationship of the detection data D1 and D2, for example (an increase of a ratio of the detection data D2 relative to the detection data D1 (=D2/D1), for example).

In a case where it is determined that the user operation determination condition is satisfied, the sensor control apparatus 10 transmits the user operation detection signal to the door control apparatus 7 in step S19 and terminates the process. At this time, the door control apparatus 7 drives and controls the door drive unit 4 and the door lock drive unit 6 based on the user operation detection signal as mentioned above. In a case where it is determined that the user operation determination condition is not satisfied, the sensor control apparatus 10 determines whether or not the changes of either the capacitance Cs1 of the upper electrode 11 or the capacitance Cs2 of the lower electrode 12 are detected in step S18.

That is, the sensor control apparatus 10 determines whether or not the detection data D1 of the upper electrode 11 which serves as the first electrode exceeds a detection threshold value Dth1 based on a magnitude relationship between the detection data D1 serving as a first capacitance and the detection threshold value Dth1 serving as a predetermined first detection threshold value. In a case where the detection data D1 exceeds the detection threshold value Dth1, the sensor control apparatus 10 returns to step S16. This is because possibility of the presence of the user is still high in a case where the detection data D1 exceeds the detection threshold value Dth1. The sensor control apparatus 10 returns to step S16 and repeats the process as long as the detection data D1 exceeds the detection threshold value Dth1 (i.e., the sensing in the continuous sensing mode is performed). A period of repeating the process corresponds to a substantially constant calculation time for operations of step S16 to step S18. That is, the detection time T corresponding to a period of sensing in the continuous sensing mode is the calculation time for the operations of step S16 to step S18.

On the other hand, in a case where it is determined that the detection data D1 falls below the detection threshold value Dth1, the sensor control apparatus 10 returns to step S11 to resume the intermittent sensing because possibility of the presence of the user is low.

According to the aforementioned embodiment, even in a case where the predetermined intermittent time T_long is elongated, the sensor control apparatus 10 may highly sensitively detect the presence of the user based on the total capacitance CT (the combined detection data DT) of the upper electrode 11 and the lower electrode 12 of which total electrode area is substantially increased because the upper electrode 11 and the lower electrode 12 are electrically connected to each other. Thus, the battery consumption is restrained without delay of the detection of the presence of the user. The sensor control apparatus 10 may then promptly detect the operation of the user relative to the back door 3 based on the individual and separate capacitances Cs1 and Cs2 (the detection data D1 and D2) of the upper electrode 11 and the lower electrode 12 which are brought to the open state after the presence of the user is detected. The sensor control apparatus 10 may securely detect the operation of the user relative to the back door 3 using a sufficiently secured time (i.e., a continuous sensing time T_sen) after the presence of the user is detected.

In the embodiment, in a case where the operation of the user is not detected in the continuous sensing mode (i.e., NO in step S17), whether or not the user is present is then determined or detected on a basis of the magnitude relationship between the detection data D1 of the upper electrode 11 and the detection threshold value Dth1. Thus, the sensor control apparatus 10 does not necessary switch the upper and lower electrodes 11 and 12 to the conductive state each time the operation of the user relative to the door is not detected, as in the intermittent sensing mode where the presence of the user is detected on a basis of the combined detection data DT of the upper and lower electrodes 11 and 12, for example.

In a case where the operation of the user is not detected in the continuous sensing mode (i.e., NO in step S17), the sensor control apparatus 10 determines (detects) whether or not the user is present on a basis of the magnitude relationship between the detection data D1 and the detection threshold value Dth1 by focusing on the upper electrode 11. Thus, in a case where the upper electrode 11 is configured or arranged so that the upper electrode 11 is further remarkably capacitively coupled to the body of the user, for example, detection accuracy of the presence of the user may further improve.

In the embodiment, the lower electrode 12 (one of the first electrode and the second electrode) includes the detectable area A2 which expands downward of the vehicle. Thus, the capacitance may not increase unless the user intentionally causes the leg portion F to comer closer to the detectable area A2, which may inhibit the operation of the user from being wrongly detected, for example. In addition, even when the user has luggage in one's arms, for example, the operation of the leg portion F may not possibly be restricted, so that operability may be inhibited from being deteriorated.

In addition, in the embodiment, the wrong detection of the user's operation is restrained by using the individual capacitances Cs1 and Cs2 of the upper electrode 11 and the lower electrode 12 in the continuous sensing mode, which may therefore inhibit the wrong operation of the back door 3.

Further, in the embodiment, the sensor control apparatus 10 repeats the continuous sensing as long as the detection data D1 exceeds the detection threshold value Dth1 (i.e., YES in step S18) even in a case where the operation of the user is not detected in the continuous sensing mode (i.e., NO in step S17). Thus, inconvenience of frequent switching from the continuous sensing mode to the intermittent sensing mode may be eliminated.

The aforementioned embodiment may be appropriately modified. For example, the door control apparatus 7 and the sensor control apparatus 10 may be integrated to configure the control portion.

The output of the oscillation signals by the capacitance measuring circuit 13 in the continuous sensing mode and corresponding input of the detection signals S1 and S2 may be performed at the upper and lower electrodes 11 and 12 simultaneously or sequentially by switching in a short time period.

In a case where the detection data D1 and D2 are individually and separately obtained for the first time after the upper electrode 11 and the lower electrode 12 are brought to the open state (in step S16), it may be determined whether or not the changes of one of the capacitance Cs1 of the upper electrode 11 and the capacitance Cs2 of the lower electrode 12 are detected prior to the determination of whether or not the user operation determination condition is satisfied in the same way as step S18. In a case where it is determined that the changes of one of the capacitance Cs1 of the upper electrode 11 and the capacitance Cs2 of the lower electrode 12 are detected, it may be then determined whether or not the user operation determination condition is satisfied.

The capacitance Cs2 (the detection data D2) of the lower electrode 12 may be used for the determination of whether or not the changes of the capacitance are detected in step S18. In addition, the intermittent sensing may be resumed regardless of the detection result of the changes of one of the capacitance Cs1 of the upper electrode 11 and the capacitance Cs2 of the lower electrode 12 in a case where the determination that the user operation determination condition is not satisfied (NO in step S17) is repeated the predetermined number of times.

In the embodiment, the detection time T in the continuous sensing mode matches the calculation time for the operations of step S16 to step S18. Alternatively, an exclusive detection time may be specified by waiting in the same way as step S12.

The upper electrode 11 may be mounted at the back door 3. In addition, the detectable area A2 of the lower electrode 12 may expand rearward.

The upper electrode 11 and the lower electrode 12 may be mounted at an upper portion and a lower portion of the back door 3 respectively. In addition, the detection of the operation of the user, for example, may be performed by the upper electrode 11 and the lower electrode 12 (the first electrode and the second electrode) mounted at the back door 3.

In the embodiment, the detection of the operation of the user, for example, is performed with the detection data D1 and D2 resulting from the A/D conversion of the detection signals S1 and S2. Alternatively, the detection signals S1 and S2 may be directly used for the detection of the operation of the user, for example, in an analog manner.

The switch member constituted by a relay, for example, may be employed. In addition, the vehicle may include a slide door which opens and closes an opening provided at a side portion of a body while moving in a front-rear direction of the vehicle. Then, the operation of the user relative to the slide door, for example, may be detected by the first electrode and the second electrode mounted at least at one of a side skirt (which is also referred to as a rocker cover) and the slide door (for example, at an inner portion of a side mud guard extending in the front-rear direction along a lower edge of the slide door).

The operation related to opening and closing of the back door 3, for example, may include door opening, unlocking, door closing, locking, setting of an operation prohibited time period, reserved locking and door closing, and opening and closing speed change.

A target of the operation related to opening and closing (i.e., door in the embodiment) may be a window glass (window regulator), a swing door, a hood, a trunk lid and a fuel lid, for example.

According to the embodiment, the vehicular door operation detecting apparatus includes the upper electrode 11 and the lower electrode 12 mounted at the vehicle 1 and positioned away from each other, each of the upper electrode 11 and the lower electrode 12 being configured to be individually capacitively coupled to the leg portion F (the body) of the user of the vehicle 1 approaching each of the upper electrode 11 and the lower electrode 12, the analog switches 16 and 17 (the switch member) switching the upper electrode 11 and the lower electrode 12 between the conductive state where the upper electrode 11 and the lower electrode 12 electrically connected to each other and the open state where the upper electrode 11 and the lower electrode 12 are electrically disconnected from each other, and the sensor control apparatus 10 controlling a switching operation of the analog switches 16 and 17 and detecting the operation of the user relative to the back door 3 for the vehicle 1 by sensing the total capacitance CT (the combined detection data DT) obtained by the upper electrode 11 and the lower electrode 12 which are switched to the conductive state in the intermittent sensing mode (the first mode) where the total capacitance CT is sensed each predetermined intermittent time T_long and by sensing the individual capacitance of each of the upper electrode 11 and the lower electrode 12 which are switched to the open state in the continuous sensing mode (the second mode) where the individual capacitance is sensed each detection time T shorter than the predetermined intermittent time T_long in a case where the presence of the user is determined because the total capacitance CT exceeds the detection threshold value Cth.

In addition, according to the embodiment, the sensor control apparatus 10 determines whether or not the user is present on a basis of the magnitude relationship between the detection data D1 (the first capacitance) of the upper electrode 11 and the detection threshold value Dth1 (the first detection threshold value) in a case where the operation of the user is not detected in the continuous sensing mode and switches to the intermittent sensing mode in a case where the detection data D1 falls below the detection threshold value Dth1 and the presence of the user is not determined.

Further, according to the embodiment, one of the first electrode and the second electrode is the lower electrode 12 including the detectable area A2 downward relative to the vehicle 1.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A vehicular door operation detecting apparatus comprising:
   a first electrode and a second electrode mounted at a vehicle and positioned away from each other, each of the first electrode and the second electrode being configured to be individually capacitively coupled to a body of a user of the vehicle approaching each of the first electrode and the second electrode;
   a switch member switching the first electrode and the second electrode between a conductive state where the first electrode and the second electrode are electrically connected to each other and an open state where the first electrode and the second electrode are electrically disconnected from each other; and
   a control portion controlling a switching operation of the switch member and detecting an operation of the user relative to a door for the vehicle by sensing a total capacitance obtained by the first electrode and the second electrode which are switched to the conductive state in a first mode where the total capacitance is sensed each predetermined intermittent time and by sensing an individual capacitance of each of the first electrode and the second electrode which are switched to the open state in a second mode where the individual capacitance is sensed each detection time shorter than the predetermined intermittent time in a case where a presence of the user is determined because the total capacitance exceeds a detection threshold value.

2. The vehicular door operation detecting apparatus according to claim 1, wherein the control portion determines whether or not the user is present on a basis of a magnitude relationship between a first capacitance of the first electrode and a first detection threshold value in a case where the operation of the user is not detected in the second mode and switches to the first mode in a case where the first capacitance falls below the first detection threshold value and the presence of the user is not determined.

3. The vehicular door operation detecting apparatus according to claim 1, wherein one of the first electrode and the second electrode is a lower electrode including a detectable area downward relative to the vehicle.

* * * * *